US012684711B2

(12) United States Patent
Cai et al.

(10) Patent No.:  US 12,684,711 B2
(45) Date of Patent:      Jul. 14, 2026

(54) CASING ASSEMBLY AND ELECTRONIC DEVICE INCLUDING THE SAME

(71) Applicant: WISTRON CORP., New Taipei City (TW)

(72) Inventors: Xiao-Yi Cai, New Taipei City (TW); Yuan Li, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 359 days.

(21) Appl. No.: 18/167,928

(22) Filed: Feb. 13, 2023

(65) Prior Publication Data

US 2024/0164032 A1      May 16, 2024

(30) Foreign Application Priority Data

Nov. 14, 2022    (CN) .......................... 202211418331.8

(51) Int. Cl.
H05K 5/02          (2006.01)

(52) U.S. Cl.
CPC .................................. H05K 5/0204 (2013.01)

(58) Field of Classification Search
CPC ...................................................... H05K 5/00
See application file for complete search history.

(56) References Cited

U.S. PATENT DOCUMENTS

| | | | |
|---|---|---|---|
| 9,060,426 B2 | 6/2015 | Mo | |
| 11,150,705 B1* | 10/2021 | Hsieh | ................... H05K 7/1487 |
| 2009/0080171 A1* | 3/2009 | Peng | ..................... H05K 7/142 |
| | | | 361/807 |

FOREIGN PATENT DOCUMENTS

| | | |
|---|---|---|
| CN | 202887051 U | 4/2013 |
| TW | I683609 B | 1/2020 |

OTHER PUBLICATIONS

TW Office Action dated Jun. 19, 2023 in Taiwan application No. 111146951.

* cited by examiner

*Primary Examiner* — Jerry Wu
(74) *Attorney, Agent, or Firm* — McClure, Qualey & Rodack, LLP

(57) ABSTRACT

A casing assembly includes a carrier casing and an operation mechanism, the carrier casing includes a plate portion and a mount portion which is located on the plate portion, the mount portion includes a first mount portion and a second mount portion connected to each other, the first mount portion has a first internal diameter, the second mount portion has a second internal diameter, the first internal diameter is greater than the second internal diameter, the operation mechanism includes an elastic arm portion and a blocking portion, the elastic arm portion is movably disposed on the plate portion, and the blocking portion is located on a side of the elastic arm portion and selectively movable close to or away from the second mount portion.

10 Claims, 18 Drawing Sheets

CASING ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202211418331.8 filed in China on Nov. 14, 2022, the entire contents of which are hereby incorporated by reference.

TECHNICAL FIELD

The disclosure relates to a casing assembly, more particularly relates to a casing assembly and an electronic device including the same.

BACKGROUND

The housing of server or computer host generally contains various detachable carrier, casing, or frame for user to flexibly add or remove specific electronic/non-electronic components or devices, such as circuit board or expansion cards.

The fixation of the conventional detachable carrier, casing, and frame rely on screws or bolts, thus the installation and removal processes must involve time-consuming and troublesome works with the use of additional hand tool. Also, as the internal space of the housing available for the operation of hand tool is getting limited, it becomes inconvenient and difficult to perform the installation and removal processes.

SUMMARY

Accordingly, one aspect of the disclosure is to provide a casing assembly and an electronic device which are favorable for realizing convenient removal and installation processes.

One embodiment of the disclosure provides a casing assembly including a carrier casing and an operation mechanism, the carrier casing includes a plate portion and a mount portion which is located on the plate portion, the mount portion includes a first mount portion and a second mount portion connected to each other, the first mount portion has a first internal diameter, the second mount portion has a second internal diameter, and the first internal diameter is greater than the second internal diameter, the operation mechanism includes an elastic arm portion and a blocking portion, the elastic arm portion is movably disposed on the plate portion, and the blocking portion is located on a side of the elastic arm portion and selectively movable close to or away from the second mount portion.

Another embodiment of the disclosure provides an electronic device including a device casing including an installation pin and a casing assembly including a carrier casing and an operation mechanism, the carrier casing includes a plate portion and a mount portion which is located on the plate portion, the plate portion is removably stacked on the device casing, and the installation pin is disposed on the mount portion, the operation mechanism includes an elastic arm portion and a blocking portion, the elastic arm portion is movably disposed on the plate portion, and the blocking portion is located on a side of the elastic arm portion and selectively blocks the installation pin.

According to the casing assembly and electronic device as discussed in the above embodiments of the disclosure, the blocking portion of the operation mechanism on the carrier casing is selectively movable to block the installation pin when the carrier casing is disposed on a device casing, thus the user is allowed to install the casing assembly on the device casing or remove the casing assembly from the device casing simply by switching the position of the blocking portion relative to the mount portion, enabling a convenient removal and installation of the casing assembly.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Firstly, referring to FIGS. 1-4, one embodiment of the disclosure provides an electronic device 9. The electronic device 9 may be, but is not limited to, a computer host, server, or a part thereof. The electronic device 9 may include a device casing 90 and a casing assembly 1. The device casing 90 is configured to support or accommodate one or more casing assemblies 1. The device casing 90 may also accommodate other electrical/non-electrical component, assembly, or module or casings as required. The casing assembly 1 is detachably disposed on the device casing 90.

Figure 8:
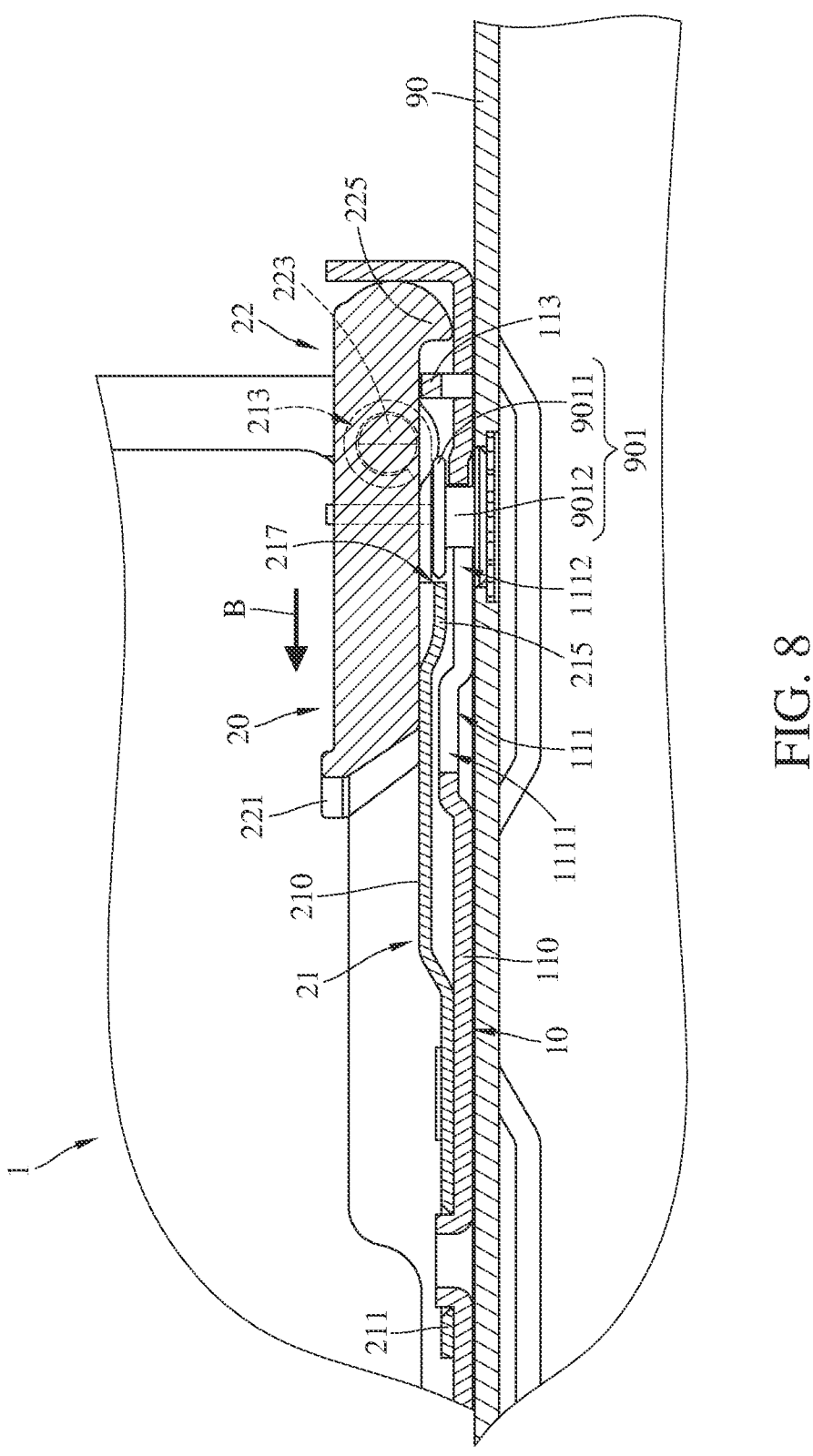
FIG. 8 is a partially-enlarged cross-sectional side view of FIG. 7.
Figure 9:
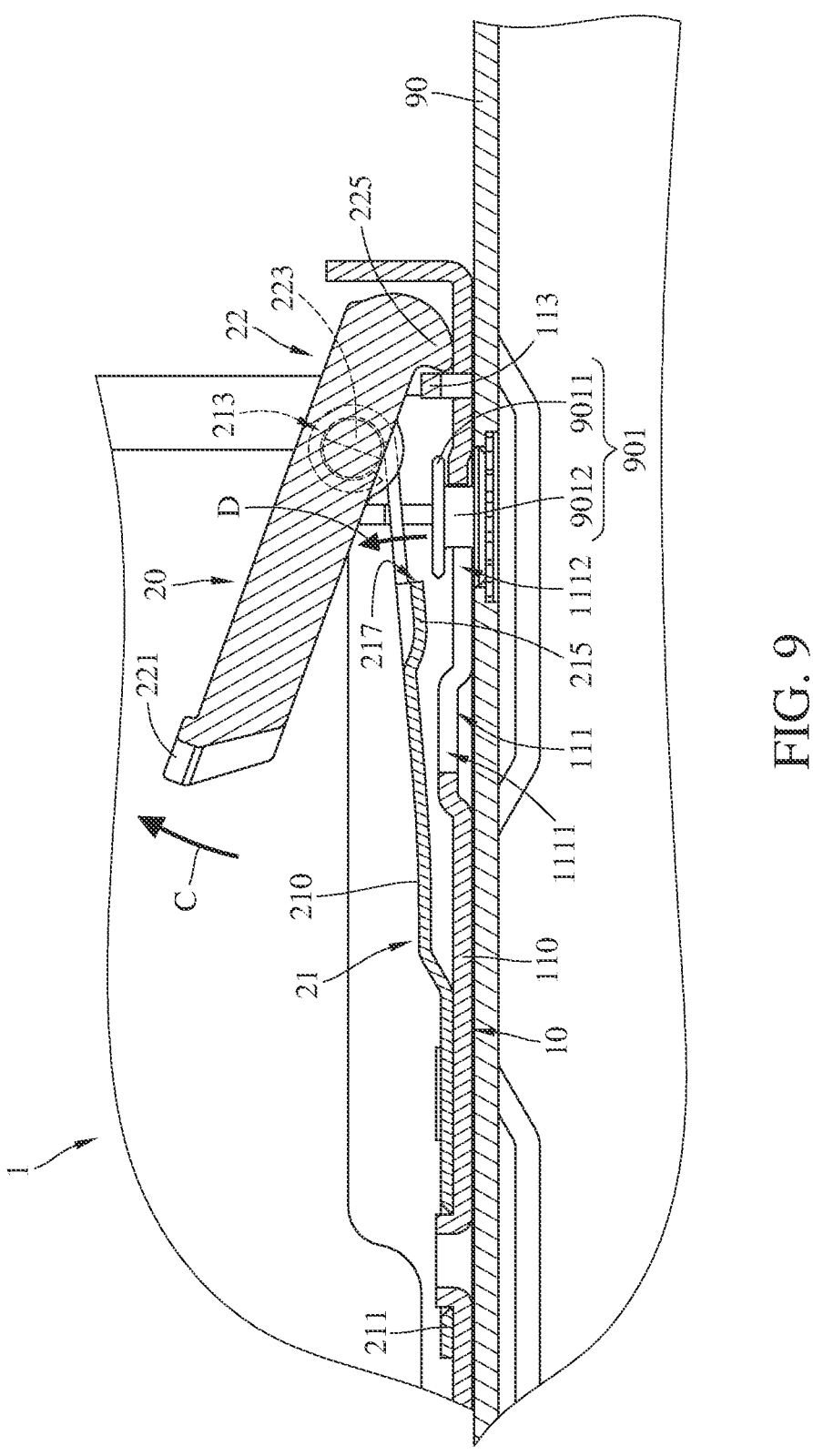
FIG. 9 is a partially-enlarged cross-sectional side view of the casing assembly when the mount portion is detached from the installation pin by a handle portion.

In this embodiment, the casing assembly 1 may include a carrier casing 10 and an operation mechanism 20. The carrier casing 10 means the part of the casing assembly 1 that is used to be installed on the device casing 90 and to support or accommodate electrical/non-electrical component, assembly, or module that is required to be installed into the device casing 90. The operation mechanism 20 is disposed on the carrier casing 10. The operation mechanism 20 is selectively switchable between a blocking status (as shown in FIG. 8) and a releasing status (as shown in FIG. 9).

In this embodiment, the carrier casing 10 may be a single piece integrally formed of any suitable metal or plastic material. The carrier casing 10 may include a plate portion 110. The plate portion 110 means the part of the carrier casing 10 that is configured to be stacked on the device casing 90. Specifically, as shown, the plate portion 110 may be a plate-shaped structure arranged at a side of the carrier casing 10 and suitable to be stacked on the device casing 90.

The carrier casing 10 may further include at least one mount portion 111. The mount portion 111 may be located on the plate portion 110. The mount portion 111 may be provided to be engaged with at least one installation pin 901 on the device casing 90. Specifically, the mount portion 111 may be a through hole formed on the plate portion 110 of the carrier casing 10. More specifically, the mount portion 111 may be a pear-shaped hole; as shown, the mount portion 111 may include a first mount portion 1111 and a second mount portion 1112 which are connected to each other. The first mount portion 1111 means the area of the mount portion 111 that is relatively wider (or, has a relatively wider aperture or a greater internal diameter compared to the second mount portion 1112) while the second mount portion 1112 means the area of the mount portion 111 that is relatively narrower (or, has a relatively narrower aperture or a smaller internal diameter compared to the first mount portion 1111); in other words, the first mount portion 1111 is wider than the narrow mount portion 1112. The installation pin 901 may be, but is not limited to be, a T pin (or, I pin) protruding from the outer surface of the device casing 90. As shown, the installation pin 901 may at least include a head portion 9011 and a neck portion 9012 which are connected to each other, a diameter of the neck portion 9012 may be slightly smaller than the width of the second mount portion 1112, a diameter of the head portion 9011 is larger than the diameter of the neck portion 9012 and the width of the second mount portion 1112 but is smaller than the width of the first mount portion 1111. As such, the installation pin 901 is able to penetrate through the first mount portion 1111, and its neck portion 9012 is able to enter the second mount portion 1112. When the neck portion 9012 enters the second mount portion 1112, the head portion 9011 is blocked and unable to pass through the second mount portion 1112, such that the installation pin 901 limits the carrier casing 10 from moving away from the device casing 90 by restricting the mount portion 111, thereby securing the position of the carrier casing 10 on the device casing 90. As introduced, the first mount portion 1111 is an area of the mount portion 111 that has a width sufficient for the head portion 9011 of the installation pin 901 to pass through, and the second mount portion 1112 means the other area of the mount portion 111 that has a width which is narrower than the first mount portion 1111 and the head portion 9011 of the installation pin 901 and only permits the neck portion 9012 of the installation pin 901 to pass through.

In addition, in this embodiment, the carrier casing 10 may further include a stopping portion 113, the stopping portion 113 may protrude from the plate portion 110; specifically, the stopping portion 113 may be located adjacent to the second mount portion 1112 of the mount portion 111.

In addition, in this embodiment, carrier casing 10 may further include a movement limiting portion 115, the movement limiting portion 115 may protrude from the plate portion 110; specifically, the movement limiting portion 115 may protrude from a surface (or, side) of the plate portion 110 in which the operation mechanism 20 is disposed, and the movement limiting portion 115 may be located adjacent to one of the mount portions 111.

In this embodiment, operation mechanism 20 may include an elastic blocking structure 21 and a handle structure 22. The elastic blocking structure 21 is movably disposed on the plate portion 110 of the carrier casing 10. The handle structure 22 is movably disposed on the elastic blocking structure 21 and is disposed on the plate portion 110 of the carrier casing 10 via the elastic blocking structure 21.

Specifically, in this embodiment, the elastic blocking structure 21 may be a single piece integrally formed of any suitable elastic metal or plastic material. The elastic blocking structure 21 may include an elastic arm portion 210, a fixed end 211, and a free end 213. The fixed end 211 may be fixed to the plate portion 110 of the carrier casing 10 using any suitable means, such as screw, bolt, rivet, welding, or adhesive. The elastic arm portion 210 is connected between the fixed end 211 and the free end 213, in other words, the free end 213 is connected to the fixed end 211 via the elastic arm portion 210. When a force is applied to the free end 213, the elastic arm portion 210 may be forced to elastically deform relative to the fixed end 211 and the plate portion 110 of the carrier casing 10. The part of the elastic arm portion 210 that is located relatively close to the free end 213 may be located between the plate portion 110 of the carrier casing 10 and the movement limiting portion 115, thus the movement limiting portion 115 is able to limit the movable range of the free end 213 relative to the fixed end 211 and the plate portion 110 of the carrier casing 10.

In addition, the elastic blocking structure 21 may further include a slope portion 215 and a blocking portion 217. The slope portion 215 may be located on the elastic arm portion 210. As shown, the slope portion 215 may be a structure protruding from a surface of the elastic arm portion 210 which faces towards the plate portion 110 of the carrier casing 10. Specifically, in FIG. 6, the slope portion 215 may be a bulge formed on the surface of the elastic arm portion 210 which faces towards the plate portion 110 of the carrier casing 10, and the slope portion 215 may be located above (or, suspended above) one of the mount portions 111 of the carrier casing 10; more specifically, the slope portion 215 may be located above (or, suspended above) the second mount portion 1112 of the mount portion 111 and partially covers (or, corresponds to) the second mount portion 1112.

The blocking portion 217 may be located on an edge (or, side) of the slope portion 215. Specifically, as can be seen from FIG. 6, the blocking portion 217 may be a step or a distal edge which is located at a side of the slope portion 215 which is located opposite to the fixed end 211. Thus, the blocking portion 217 may also be located above (or, suspended above) the second mount portion 1112 of the mount portion 111. Optionally, the blocking portion 217 may be at an angle to the elastic arm portion 210. For example, as can be seen from FIG. 6, the blocking portion 217 may be perpendicular to the elastic arm portion 210.

In this embodiment, the handle structure 22 may include a handle portion 221, an engagement portion 223, and a distal portion 225. The engagement portion 223 may be rotatably connected to the free end 213 of the elastic blocking structure 21 so that the handle structure 22 is rotatable relative to the elastic blocking structure 21. In this embodiment, the handle structure 22 is selectively switched between an original position (as shown in FIG. 8) and a releasing position (as shown in FIG. 9). The handle portion 221 and the distal portion 225 are respectively located at two opposite sides of the handle structure 22 and are connected to the elastic blocking structure 21 via the engagement portion 223. The handle portion 221 may be located at the elastic blocking structure 21 of the elastic arm portion 210 and the distal portion 225 may be located outside the free end 213. The distal portion 225 is selectively in contact with the stopping portion 113 of the carrier casing 10; specifically, as can be seen from FIG. 6, the distal portion 225 may be located outside the right side of the free end 213.

As such, the handle structure 22 can cause the blocking portion 217 of the elastic blocking structure 21 to block the installation pin 901, and selectively operating the handle structure 22 can cancel the limitation of the blocking portion 217 to the installation pin 901. The details of the operation of the casing assembly 1 are given below with reference to FIG. 2 and with further reference to FIGS. 5-8.

Figure 1:
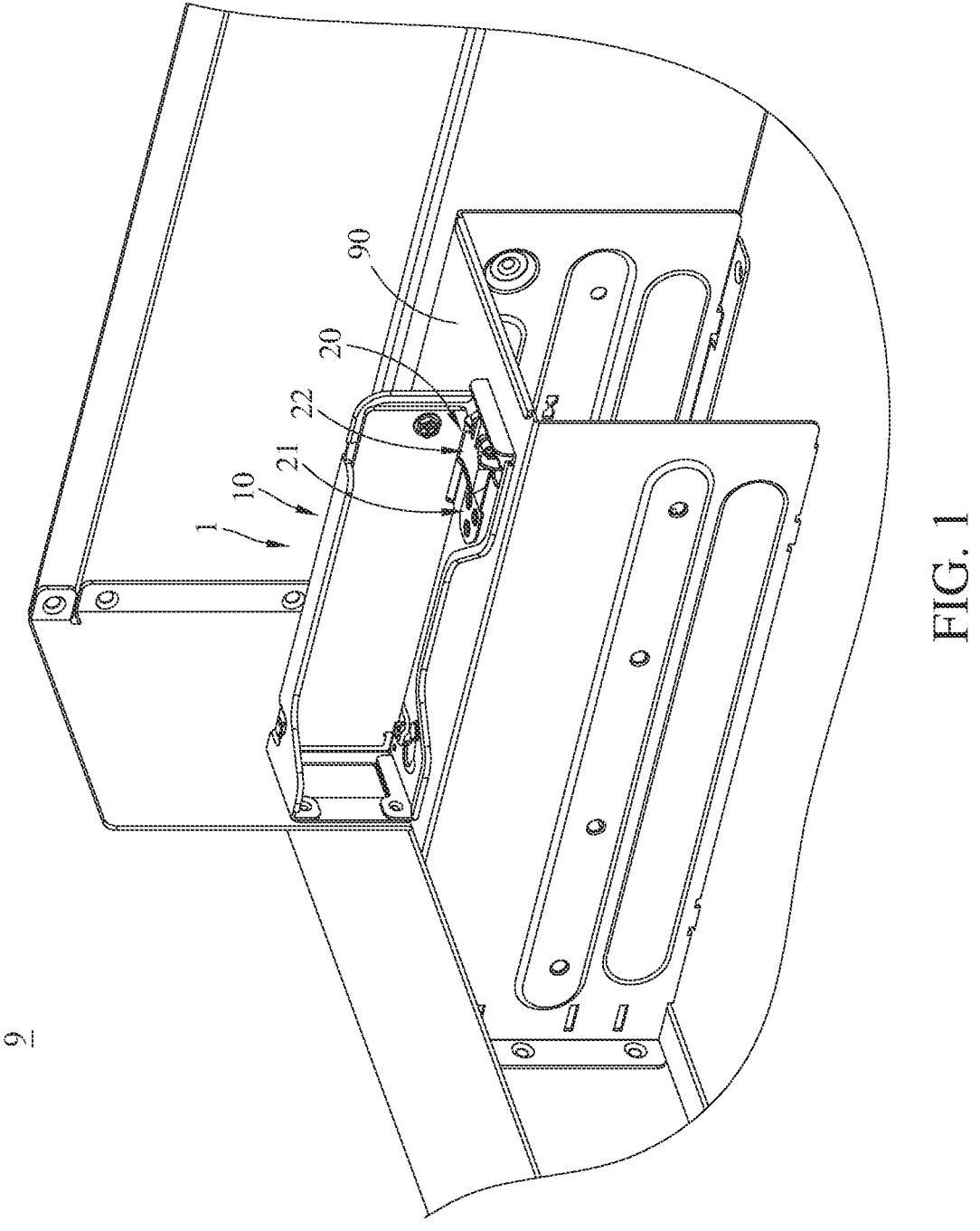
FIG. 1 is a partially-enlarged perspective view of an electronic device according to one embodiment of the disclosure.
Figure 2:
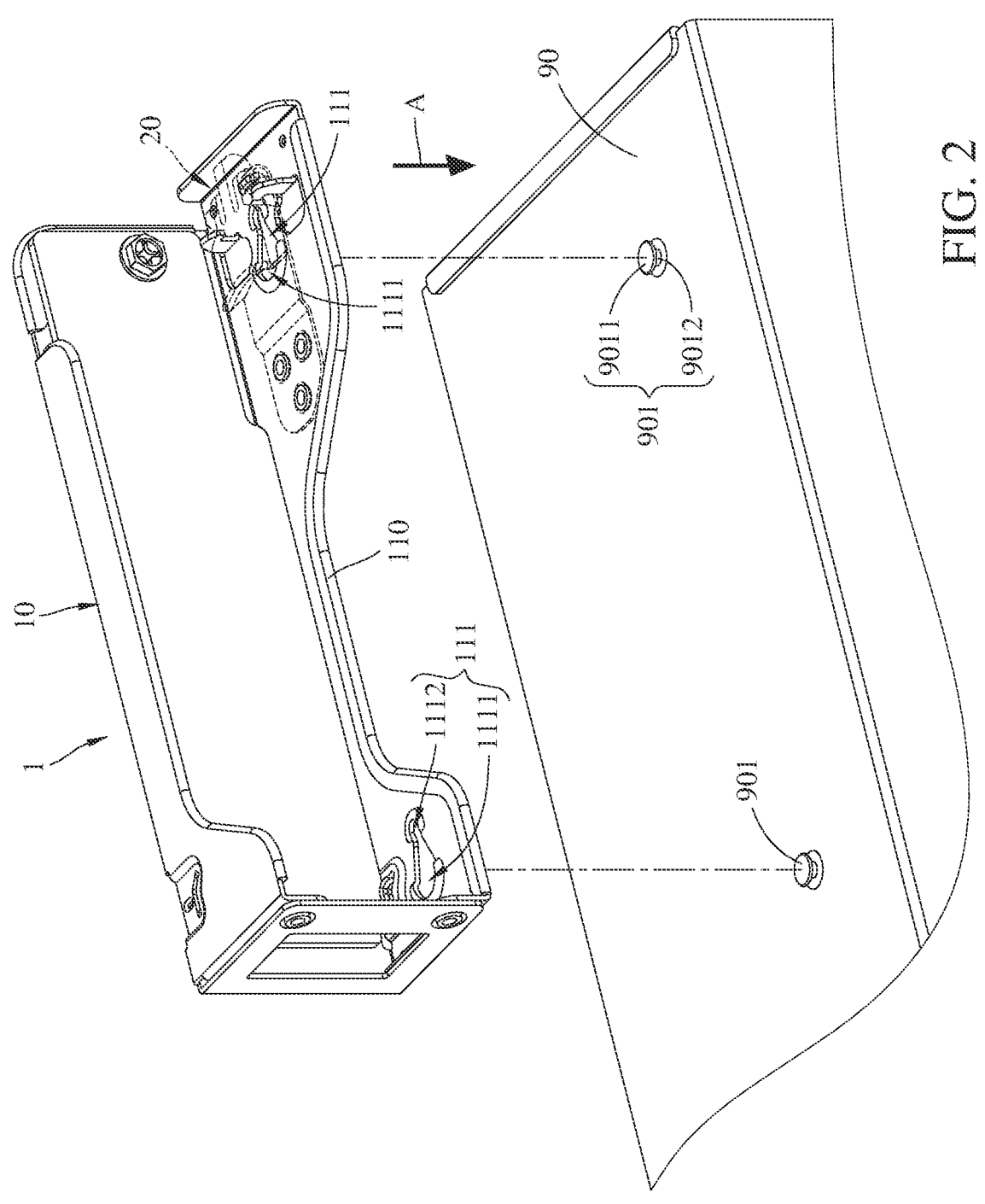
FIG. 2 is an exploded view of a casing assembly and a device casing of the electronic device FIG. 1.
Figure 3:
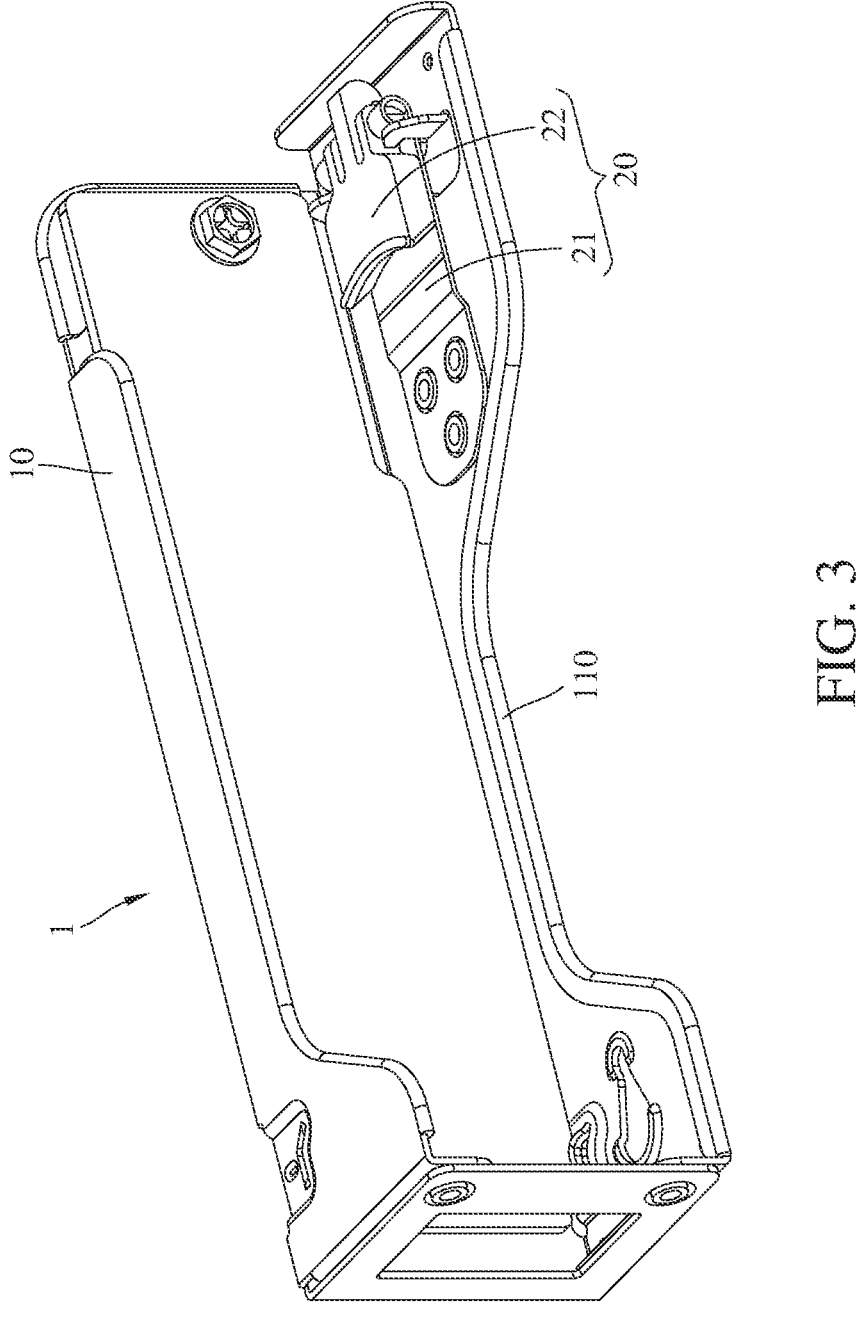
FIG. 3 is a perspective view of the casing assembly in FIG. 2.
Figure 4:
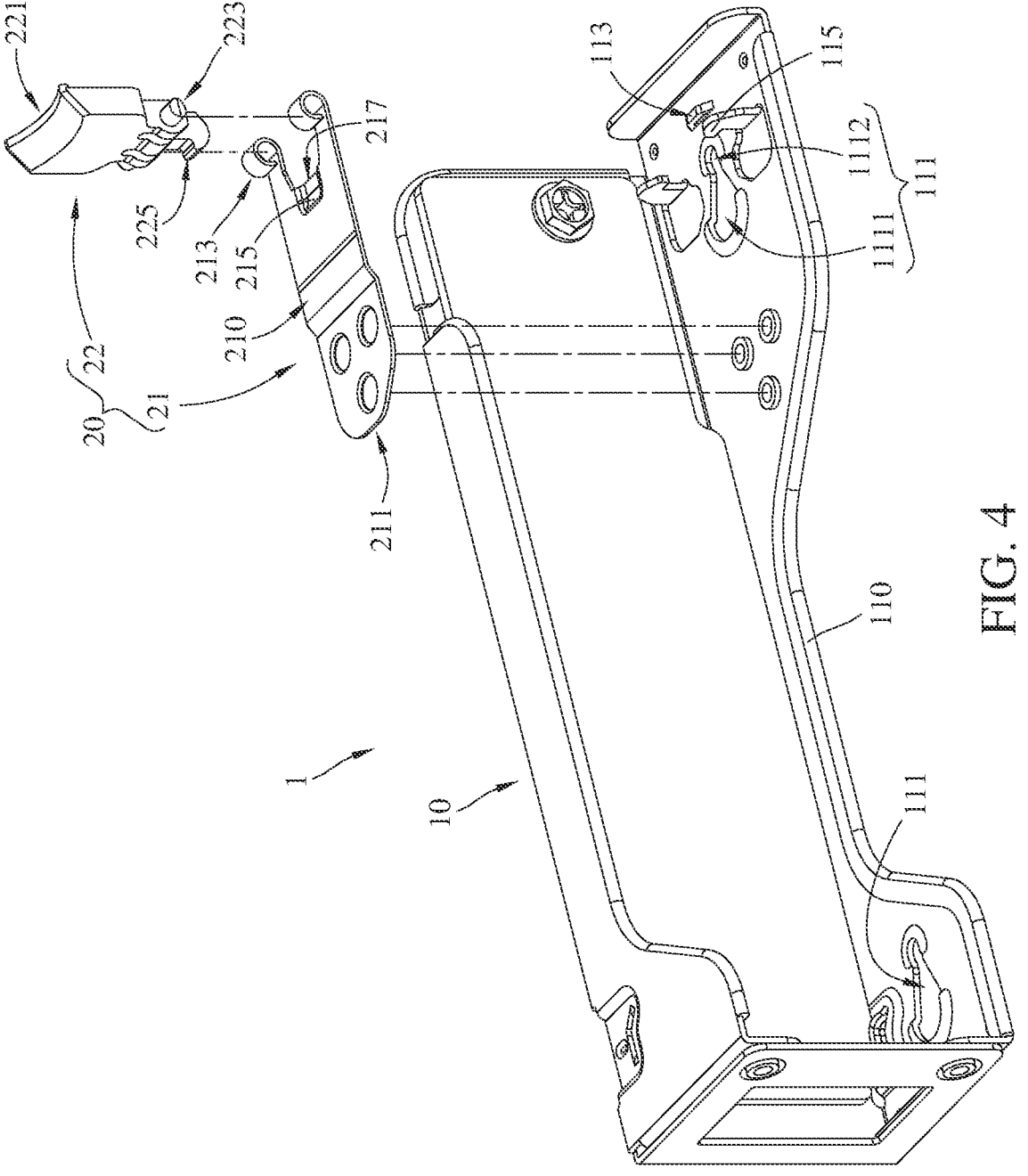
FIG. 4 is an exploded view of the casing assembly in FIG. 3.

Firstly, as indicated by the arrow A in FIG. 2, the casing assembly 1 may be placed onto the device casing 90, specifically, during the placement of the casing assembly 1 to the device casing 90, the first mount portion 1111 of the mount portion 111 of the carrier casing 10 may be aligned with the installation pin 901 of the device casing 90 so that the head portion 9011 of the installation pin 901 is allowed to insert into the first mount portion 1111 of the mount portion 111 and to pass through the plate portion 110 of the carrier casing 10.

Figure 5:
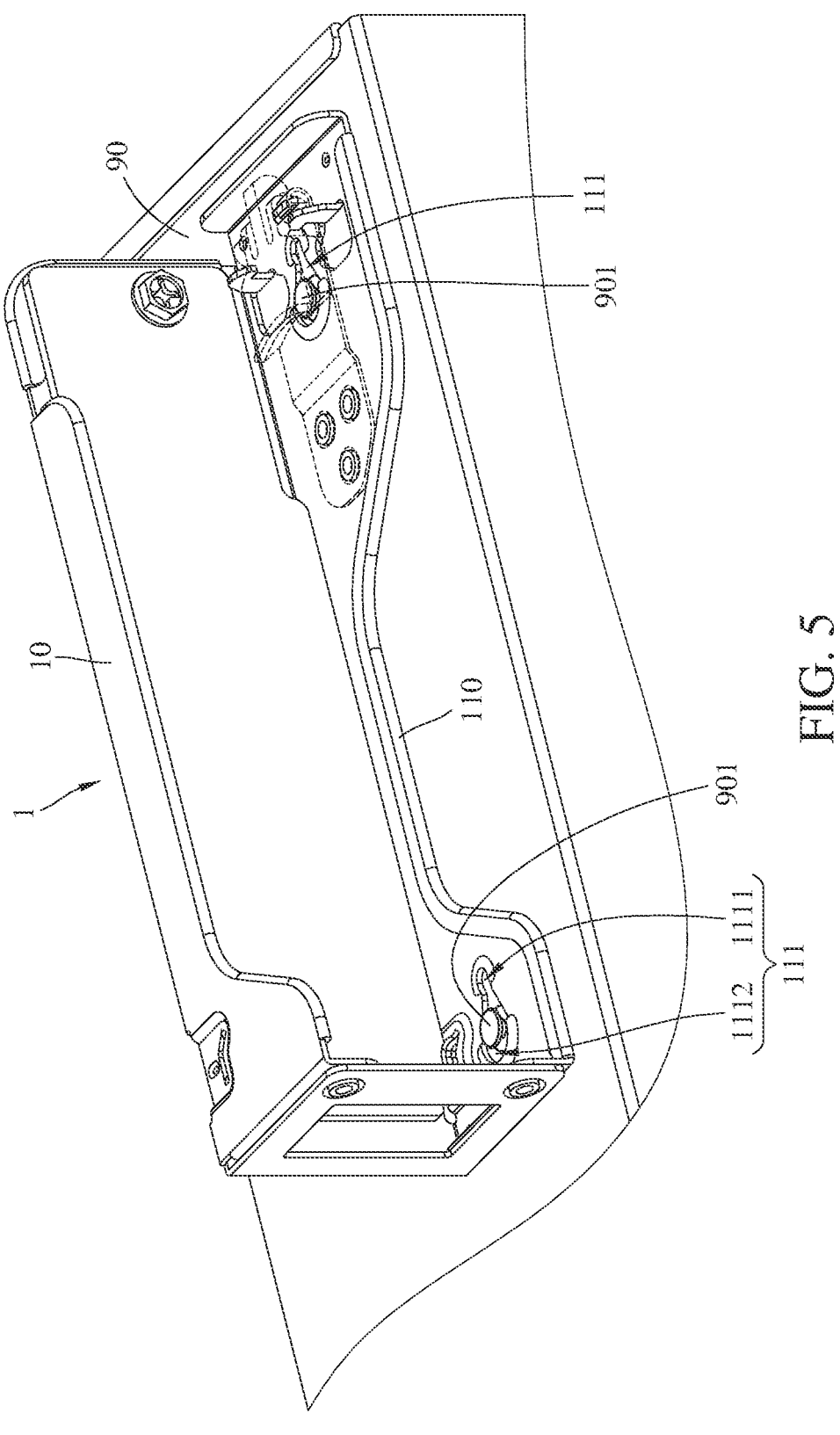
FIG. 5 is a perspective view of the casing assembly when installation pins of the device casing are inserted into mount portions of the casing assembly.
Figure 6:
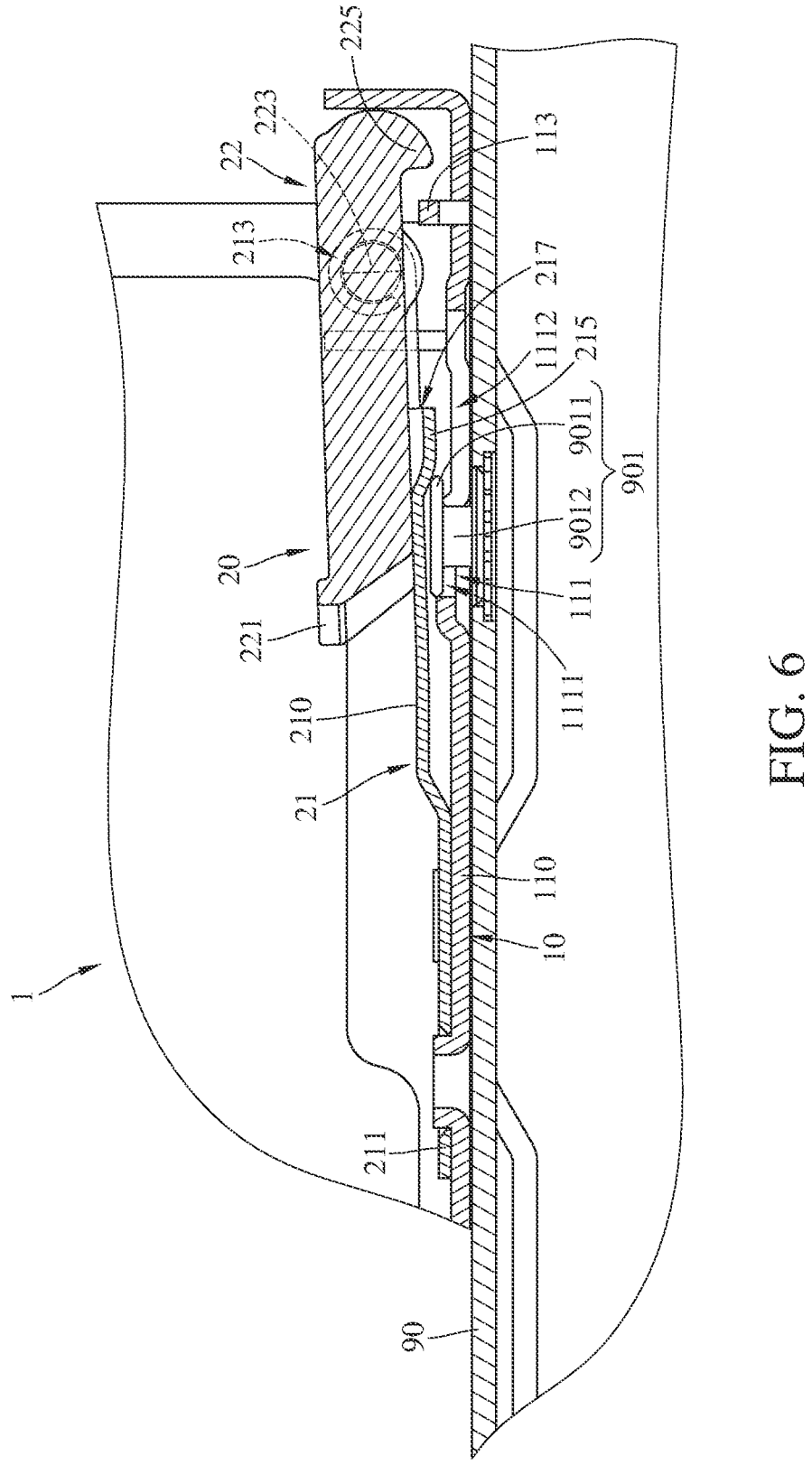
FIG. 6 is a partially-enlarged cross-sectional side view of FIG. 5.

By doing so, the casing assembly 1 can be disposed on the device casing 90 and the installation pin 901 can be disposed through the first mount portion 1111 of the mount portion 111 (as shown in FIGS. 5-6). At this moment, when the handle structure 22 is not yet moved by the user, the handle structure 22 stays in the original position, and the elastic blocking structure 21 of the operation mechanism 20 may be in a position that the slope portion 215 stays away from the mount portion 111 since the head portion 9011 of the installation pin 901 pushes the elastic arm portion 210 away from the plate portion 110.

Figure 7:
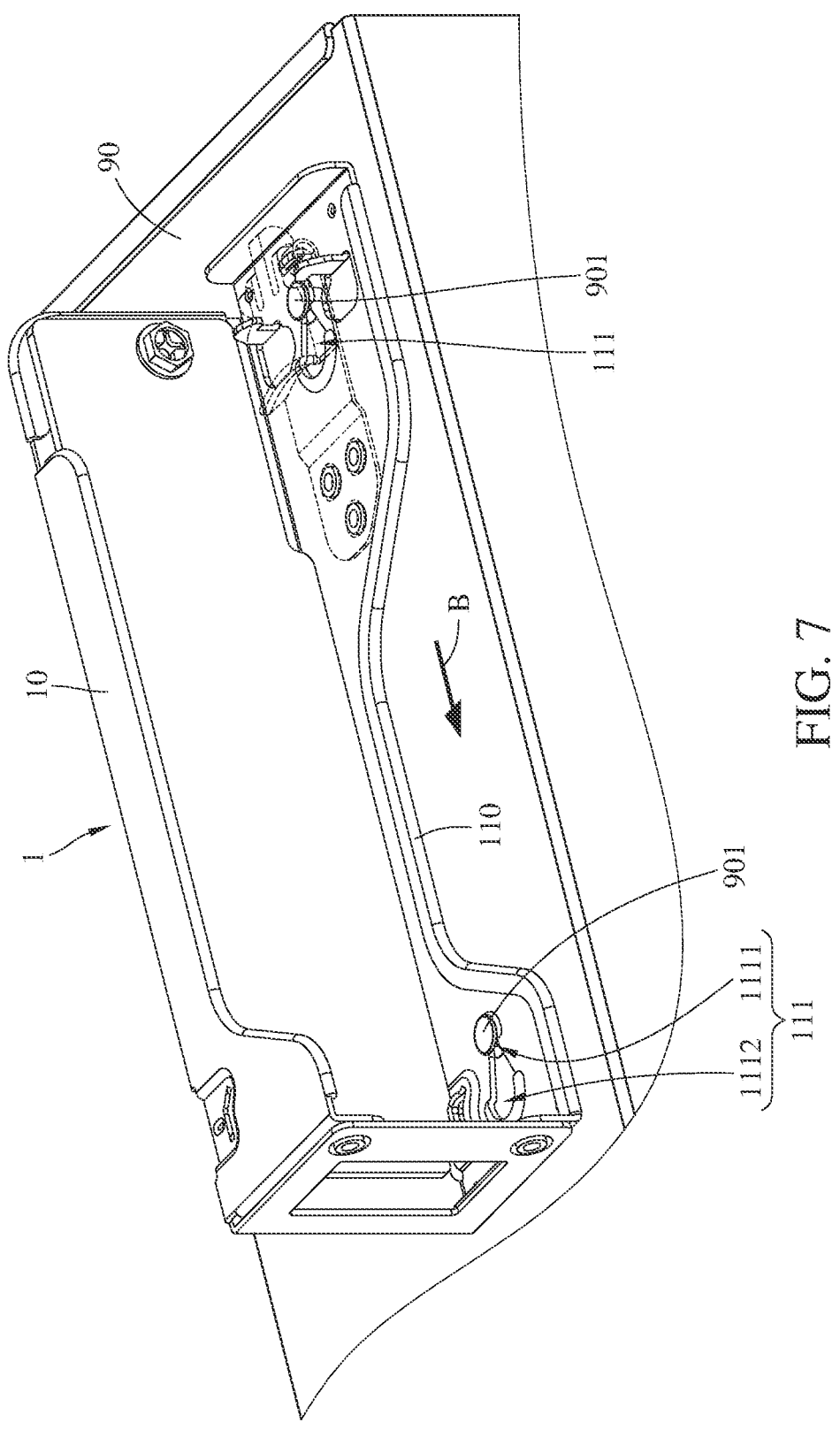
FIG. 7 is a perspective view of the casing assembly when the casing assembly is moved to the installed position relative to the device casing.

Then, in FIGS. 7-8, the casing assembly 1 is moved relative to the device casing 90 as indicated by the arrow B to make the installation pin 901 move into the second mount portion 1112 from the first mount portion 1111. By doing so, the head portion 9011 of the installation pin 901 can slide over the slope portion 215 of the elastic blocking structure 21 so that the elastic arm portion 210 can then restore the position of the slope portion 215 to make the blocking portion 217 block at a side of the head portion 9011 of the installation pin 901; specifically, when the installation pin 901 is removed from the elastic blocking structure 21, the blocking portion 217 returns to its original position and therefore can stay at a side of the head portion 9011 which is located close to the first mount portion 1111 of the mount portion 111, thereby preventing the installation pin 901 from moving towards the first mount portion 1111. At this moment, the operation mechanism 20 is in the blocking status, at least part of the plate portion 110 of the carrier casing 10 is limited between the head portion 9011 of the installation pin 901 and the outer surface of the device casing 90, thus the carrier casing 10 is unable to move away from the device casing 90; also, the blocking portion 217 is at a side of the head portion 9011 which is located close to the first mount portion 1111 of the mount portion 111 so that the blocking portion 217 is able to keep the installation pin 901 in the second mount portion 1112 of the mount portion 111.

As introduced, the casing assembly 1 can be firmly installed on the device casing 90 and kept in the installed position simply by the action of placing the casing assembly 1 onto the device casing 90 and sliding the casing assembly 1 relative to the device casing 90. The installation of the casing assembly 1 is simple, convenient, without additional hand tool and is favorable for improving the efficiency of relevant processes.

Then, the removal of the casing assembly 1 from the device casing 90 can be realized by simple steps with reference to FIG. 9. As shown, the handle portion 221 of the handle structure 22 of the operation mechanism 20 may be pivoted in the direction as indicated by arrow C to switch the handle structure 22 from the original position to the releasing position. By doing so, the handle portion 221 of the handle structure 22 is moved away from the elastic arm portion 210 of the elastic blocking structure 21, and the distal portion 225 of the handle structure 22 presses against the stopping portion 113 of the carrier casing 10, thereby causing the engagement portion 223 of the handle structure 22 to move away from the plate portion 110 of the carrier casing 10. During this movement of the engagement portion 223, the distal portion 225 of the handle structure 22 which is abutting the plate portion 110 is considered as a fulcrum for rotating the handle structure 22, such that the engagement portion 223 of the handle structure 22 can move the free end 213 and the blocking portion 217 of the elastic blocking structure 21 away from the plate portion 110 of the carrier casing 10 (e.g., the direction as indicated by the arrow D). As a result, the blocking portion 217 is moved away from the head portion 9011 of the installation pin 901, the operation mechanism 20 is switched to the releasing status, and then the head portion 9011 of the installation pin 901 can be allowed to move towards the first mount portion 1111 of the mount portion 111. As shown, since the rotation of the handle structure 22 is activated by applying force to the handle portion 221 and takes the distal portion 225 as a fulcrum to move the engagement portion 223 between the handle portion 221 and the distal portion 225, the free end 213 and the blocking portion 217 can be moved away from the head portion 9011 of the installation pin 901 by an effort-saving manner. Then, the casing assembly 1 can be removed from the device casing 90 by reversely following the steps of FIGS. 2 and 7-8.

As introduced, the casing assembly 1 can be quickly removed from the device casing 90 simply by action of rotating the handle structure 22 and reversely pushing the casing assembly 1, thus the removal of the casing assembly 1 is simple, convenient, without additional hand tool and is favorable for improving the efficiency of relevant processes.

Figure 10:
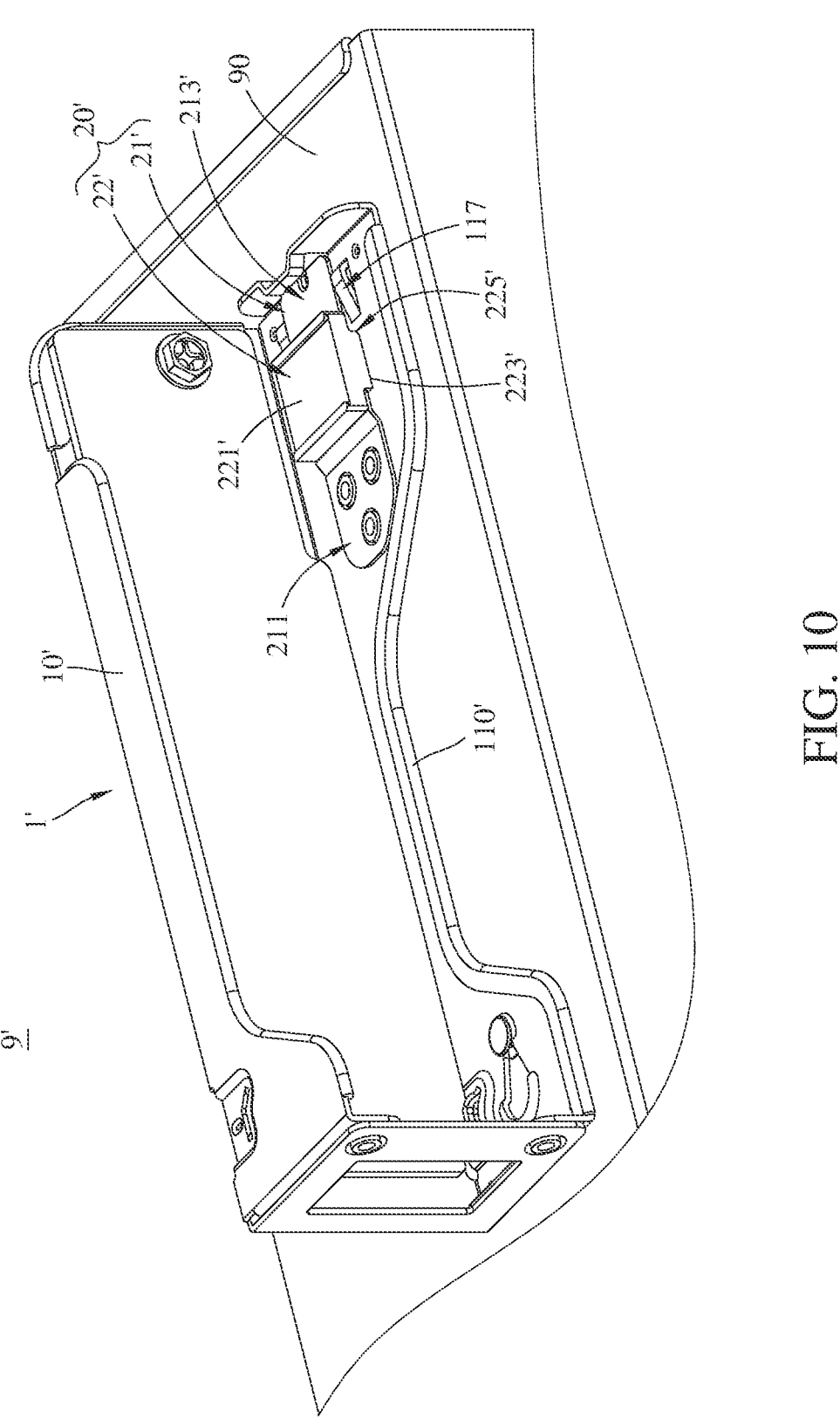
FIG. 10 is a partially-enlarged perspective view of an electronic device according to another embodiment of the disclosure when a casing assembly is disposed on a device casing.
Figure 11:
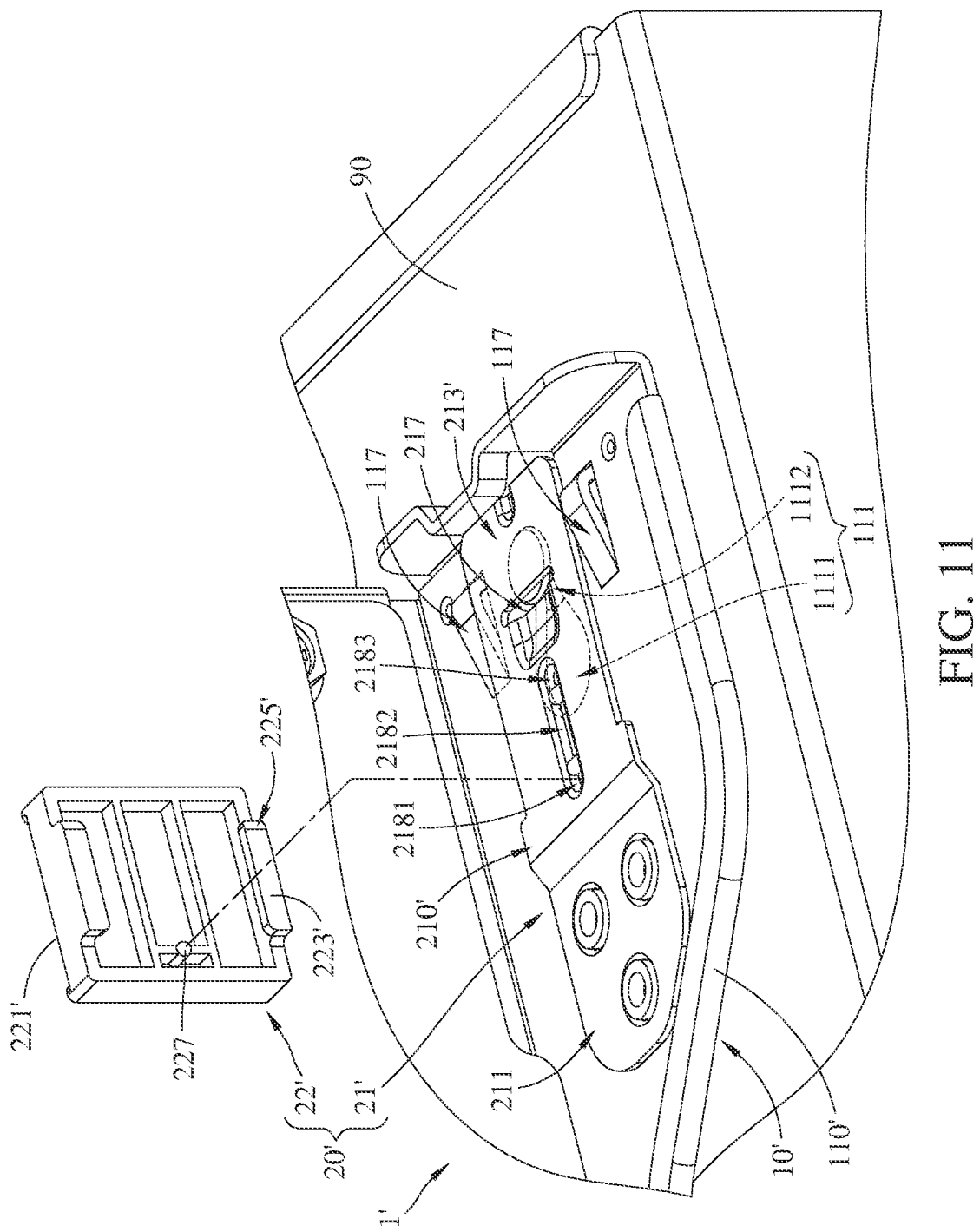
FIG. 11 is a partially-enlarged exploded view of FIG. 10.

The previous embodiment is one of exemplary embodiments of the disclosure and is not intended to limit the disclosure. Please refer FIGS. 10-12, another embodiment of the disclosure provides an electronic device 9', but for the purpose of simplicity, only the main differences between the introduced embodiment and the previous embodiments will be described in detail, and the same or similar parts can be comprehended with reference to the corresponding paragraphs and thus will not be repeatedly described hereinafter. It is also noted that the same reference number denote the same component or element.

As shown, in this embodiment, a casing assembly 1' may include a carrier casing 10' whose plate portion 110' has at least one inclined guide surface 117, the inclined guide surface 117 protrudes from the plate portion 110' and corresponds to the mount portion 111 of the plate portion 110'. For example, the inclined guide surface 117 may be located at a side of the mount portion 111. Specifically, at least part of the mount portion 111 may be located between two inclined guide surfaces 117. More specifically, the second mount portion 1112 of the mount portion 111 may be located two inclined guide surfaces 117.

The casing assembly 1' may include an operation mechanism 20' whose handle structure 22' is slidably disposed on an elastic blocking structure 21'. Specifically, the handle structure 22' may include a handle portion 221' being the part of the handle structure 22' which is located relatively away from the elastic blocking structure 21', the handle portion 221' and an engagement portion 223' may be respectively located at two opposite sides of the handle structure 22', the engagement portion 223' may be slidably engaged at two opposite side edges of the elastic blocking structure 21'. As such, the handle structure 22' may be selectively moved to an elastic arm portion 210' or a free end 213' of the elastic blocking structure 21', and the engagement portion 223' may be selectively moved onto the inclined guide surface 117. In this embodiment, distal portion 225' may be one of the sides or edges of the engagement portion 223'.

In addition, the handle structure 22' may further include a positioning protrusion 227 which protrudes from a surface of the handle structure 22' which faces towards the elastic blocking structure 21', and there are a first positioning hole portion 2181, a guide groove 2182, and a second positioning hole portion 2183 formed on a surface of the elastic blocking structure 21' which faces towards the handle structure 22'. The guide groove 2182 is connected between the first positioning hole portion 2181 and the second positioning hole portion 2183. During the sliding of the handle structure 22' relative to the elastic blocking structure 21', the positioning protrusion 227 may be selectively located in the first positioning hole portion 2181, the guide groove 2182, or the second positioning hole portion 2183.

Figure 12:
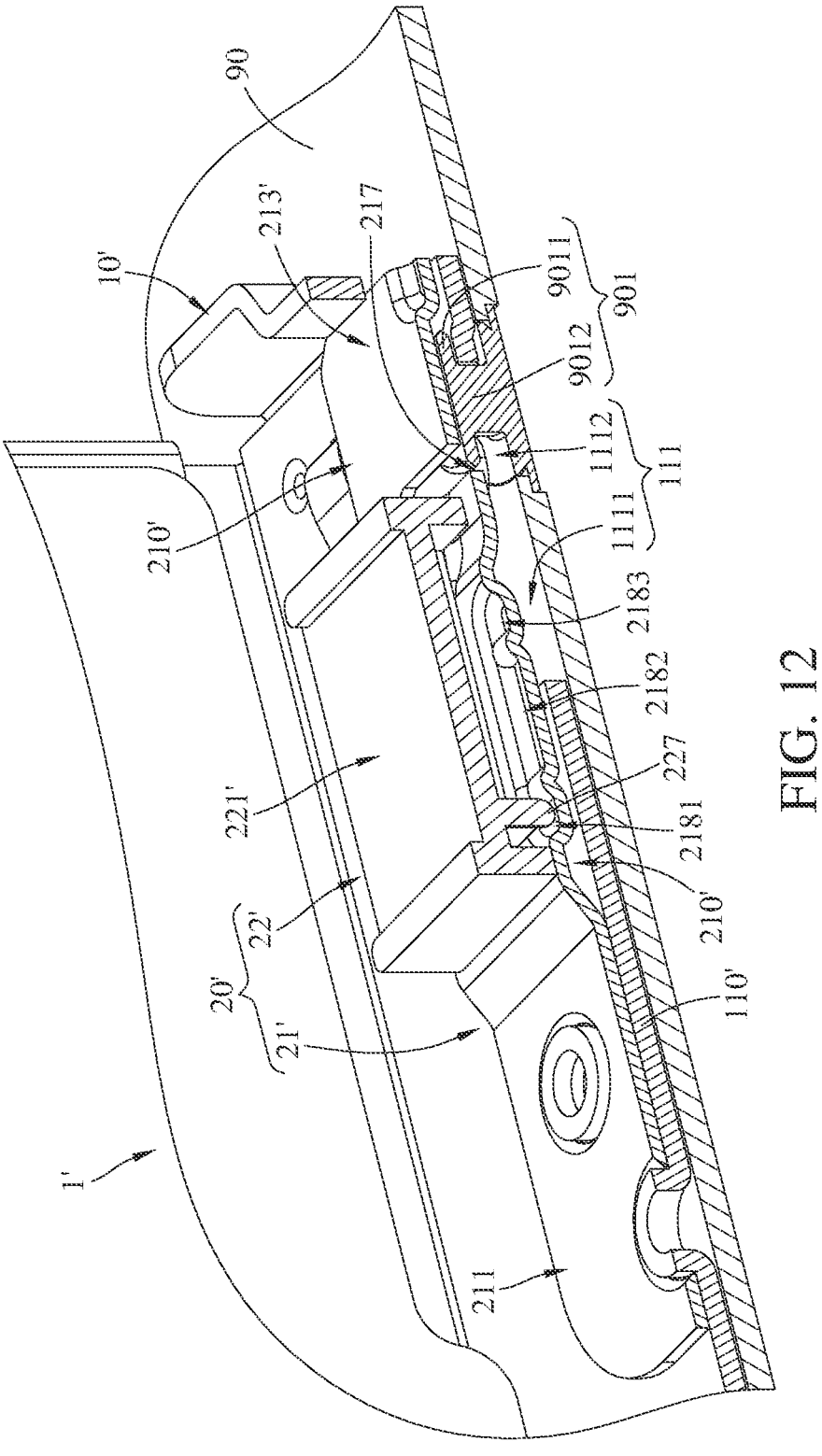
FIG. 12 is a partially-enlarged cross-sectional side view of FIG. 10.

Then, the details of the operation of the casing assembly 1' are given below with reference to FIG. 12 and with further reference to FIGS. 13-14. By performing steps similar to that of the previous embodiment, such as placing the casing assembly 1' on the device casing 90 and then pushing the casing assembly 1', the installation pin 901 on the device casing 90 will enter the second mount portion 1112 of the mount portion 111 and the blocking portion 217 of the elastic blocking structure 21' will block at a side of the head portion 9011 of the installation pin 901 which is located close to the first mount portion 1111 of the mount portion 111 so as to limit the installation pin 901 in the second mount portion 1112. By doing so, as shown in FIG. 12, the positioning protrusion 227 of the handle structure 22' may engage with the first positioning hole portion 2181 of the elastic blocking structure 21' so as to keep the handle structure 22' in the original position.

Figure 13:
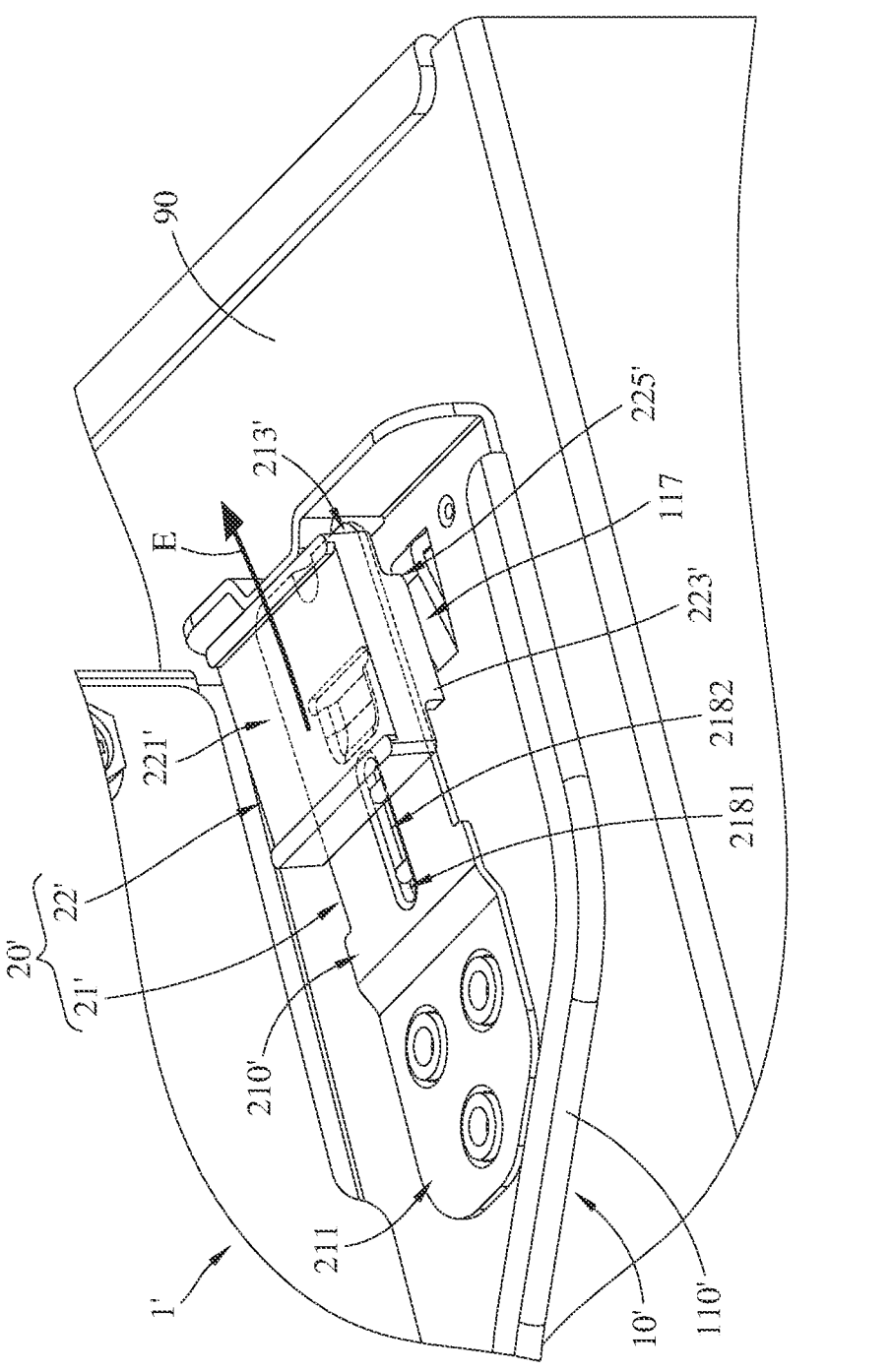
FIG. 13 is a partially-enlarged of the casing assembly according to another embodiment of the disclosure when the mount portion is detached from the installation pin by a handle portion.
Figure 14:
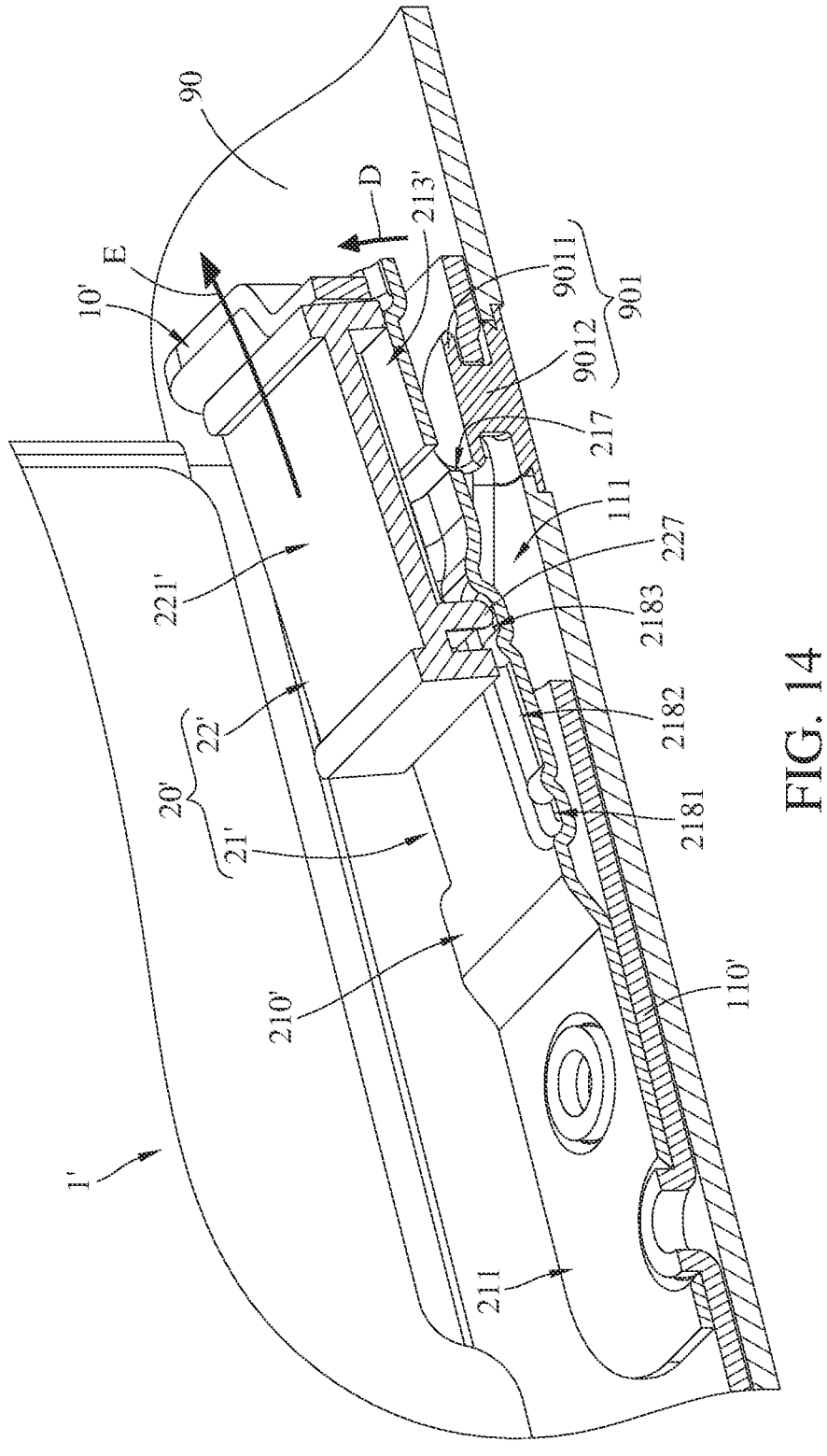
FIG. 14 is a partially-enlarged cross-sectional side view of FIG. 13.
Figure 15:
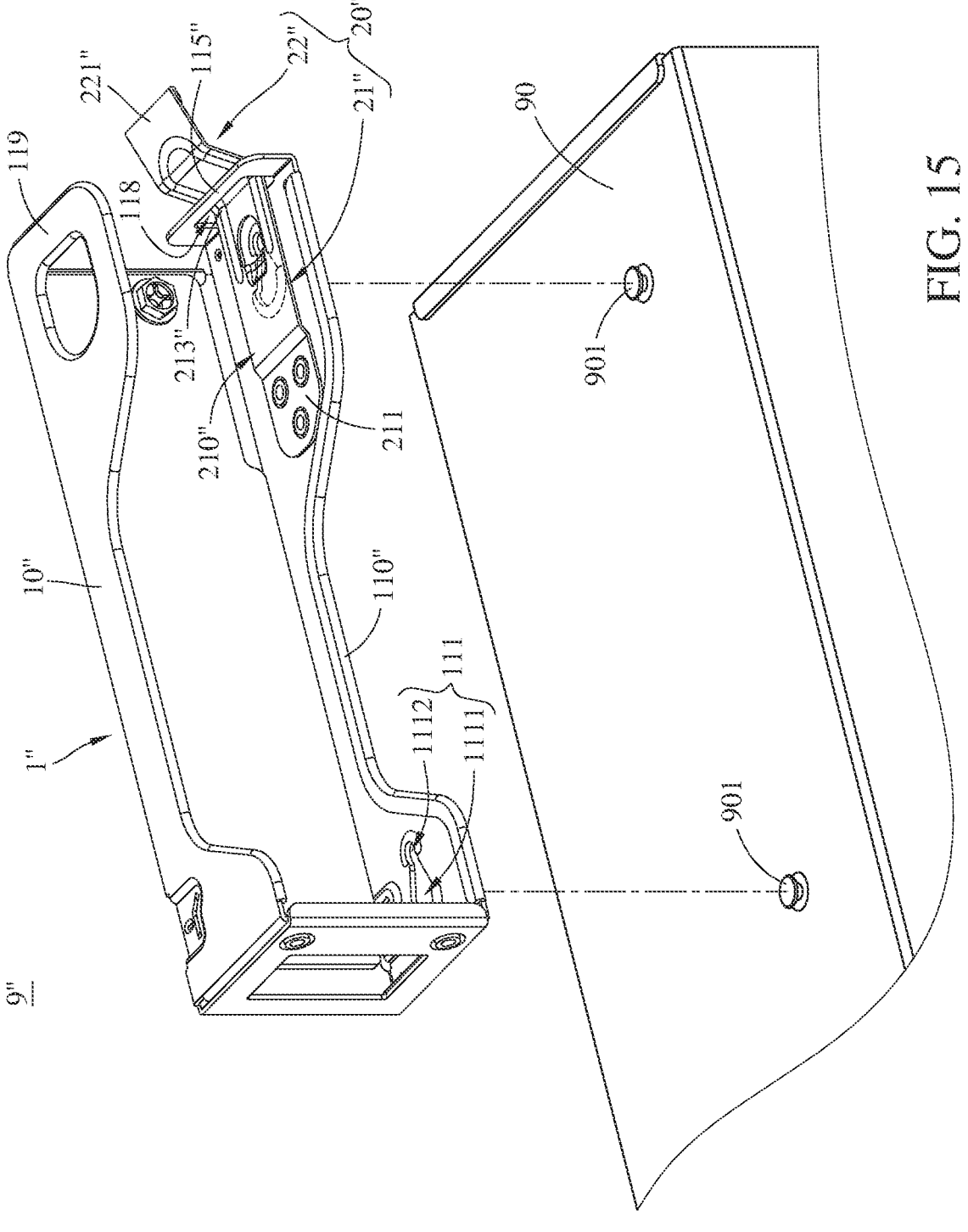
FIG. 15 is an exploded view of a casing assembly and a device casing of the electronic device according to another embodiment of the disclosure.
Figure 16:
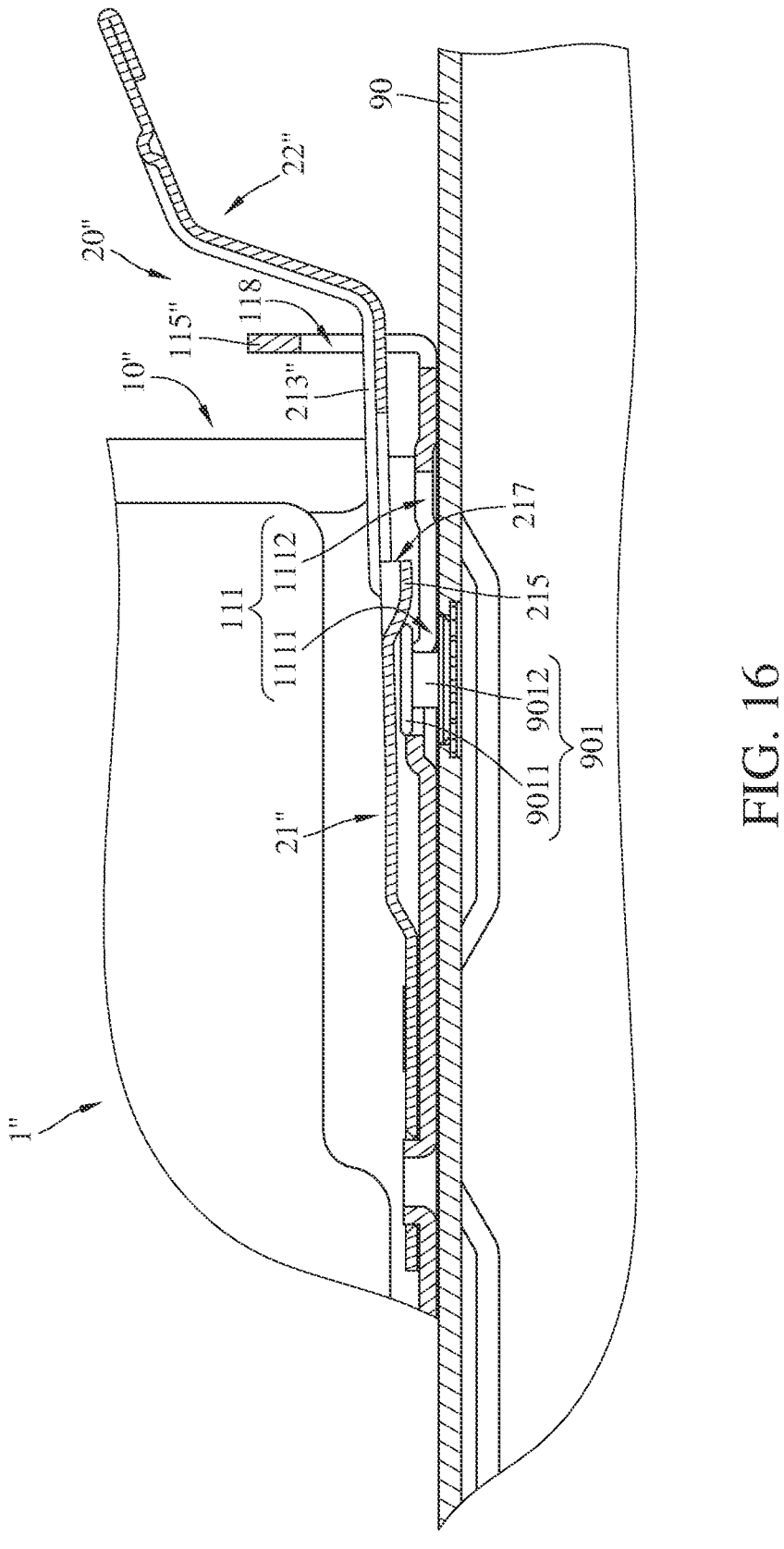
FIG. 16 is a cross-sectional side view of the casing assembly when installation pin of the device casing is inserted into mount portion of the casing assembly.
Figure 17:
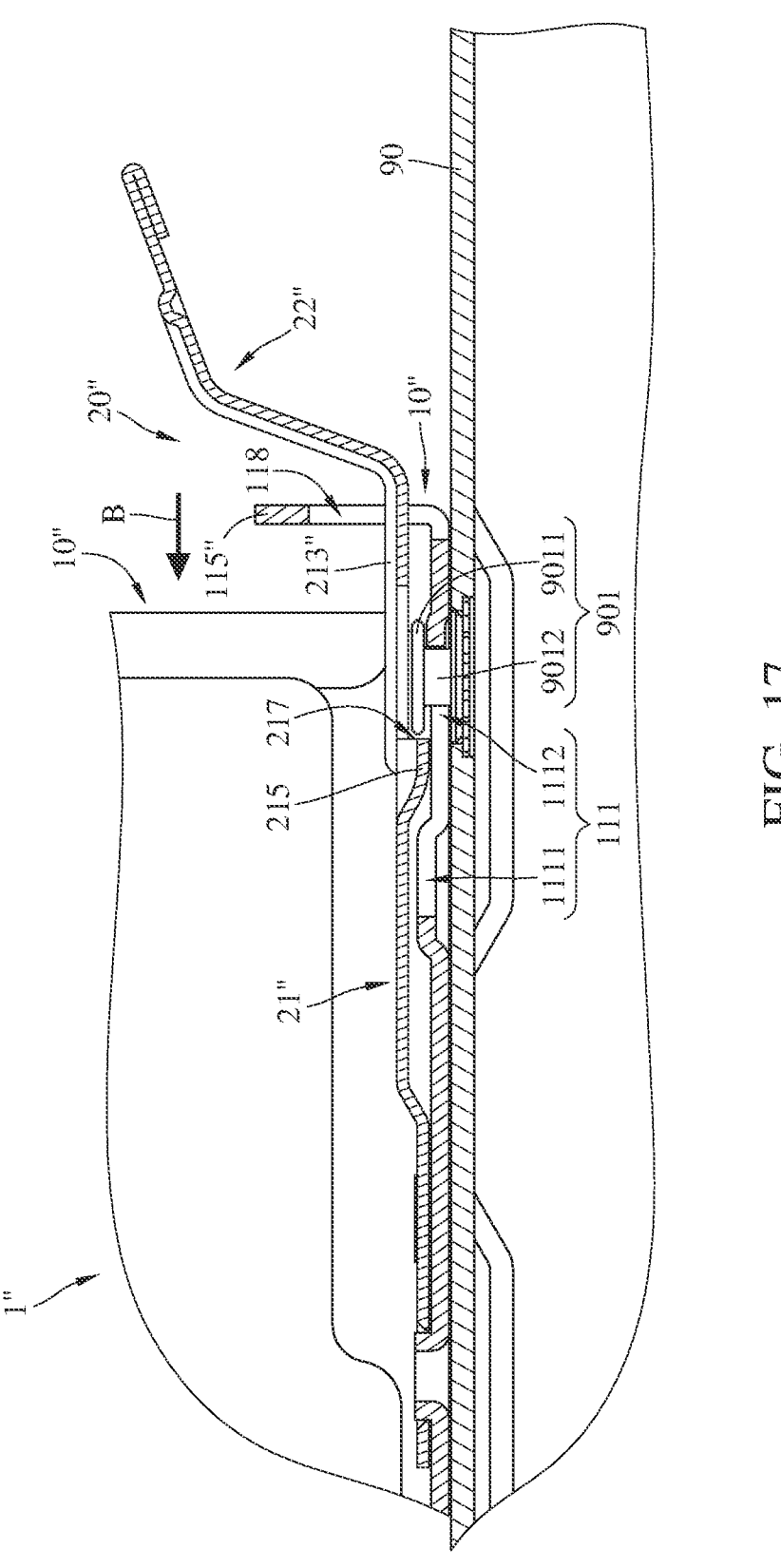
FIG. 17 is a cross-sectional side view of the casing assembly when the casing assembly is moved to the installed position relative to the device casing.

Then, in FIGS. 13-14, the handle portion 221' of the handle structure 22' can be slide in the direction as indicated by arrow E to release the casing assembly 1' from the device casing 90. By doing so, the handle structure 22' may slide from the original position to the releasing position along the elastic blocking structure 21', and the engagement portion 223' is moved onto the inclined guide surface 117. During such a movement, the engagement portion 223' of the handle structure 22' is moved towards the free end 213' from the elastic arm portion 210' so that the distal portion 225' and the engagement portion 223' of the handle structure 22' can be slidably located on the inclined guide surface 117. Also, the positioning protrusion 227 of the handle structure 22' is removed from the first positioning hole portion 2181 and reaches the second positioning hole portion 2183 through the guide groove 2182, such that the handle structure 22' is kept in the releasing position.

While the engagement portion 223' of the handle structure 22' is sliding towards the free end 213' of the elastic blocking structure 21' along the inclined guide surface 117, the handle structure 22' and the free end 213' are gradually moved away from the plate portion 110' of the carrier casing 10' (e.g., the direction as indicated by the arrow D) due to the inclination of the inclined guide surface 117. As a result, the blocking portion 217 of the elastic blocking structure 21' is moved away from the head portion 9011 of the installation pin 901, the operation mechanism 20' is switched to the releasing status, and then the head portion 9011 of the installation pin 901 can be allowed to move towards the first mount portion 1111 of the mount portion 111. Then, similarly, the casing assembly 1' can be quickly removed from the device casing 90 simply by action of reversely pushing the casing assembly 1'.

As introduced, the installation of the casing assembly 1' onto the device casing 90 can be realized simply by placing and pushing the casing assembly 1', and the removal of the casing assembly 1' from the device casing 90 can be realized simply by pushing the handle structure 22' and reversely pushing the casing assembly 1', thus the installation and removal of the casing assembly 1' are simple, convenient, without additional hand tool and is favorable for improving the efficiency of relevant processes.

Please refer to FIGS. 15-18, another embodiment of the disclosure provides an electronic device 9", but for the purpose of simplicity, only the main differences between the introduced embodiment and the previous embodiments will be described in detail, and the same or similar parts can be comprehended with reference to the corresponding paragraphs and thus will not be repeatedly described hereinafter. It is also noted that the same reference number denote the same component or element.

As shown, in this embodiment, a casing assembly 1" may include a carrier casing 10" whose plate portion 110" may have a movement limiting portion 115", the movement limiting portion 115" may define a through hole 118 on the plate portion 110", the through hole 118 is configured for a handle structure 22" of a operation mechanism 20" to penetrate through. In this embodiment, the operation mechanism 20" may be a single piece integrally formed of any suitable elastic material; that is, the handle structure 22" of the operation mechanism 20" may be integrally formed with a free end 213" of an elastic blocking structure 21". Specifically, the handle structure 22" may integrally extends outward from the free end 213" of the elastic blocking structure 21". The handle structure 22" may be disposed through the through hole 118 and is at an angle to the elastic arm portion 210" of the elastic blocking structure 21". In addition, in this embodiment, the carrier casing 10" may further include an eaves portion 119, the eaves portion 119 and the plate portion 110" may be respectively located at two opposite sides of the carrier casing 10" and the eaves portion 119 may correspond to the movement limiting portion 115".

The details of the operation of the casing assembly 1' are given below. Firstly, in FIGS. 15-16, by performing steps similar to that of the previous embodiment, such as placing the casing assembly 1" on the device casing 90, the head portion 9011 of the installation pin 901 penetrates through the first mount portion 1111 of the mount portion 111. Then, in FIG. 17, by performing steps similar to that of the previous embodiment, such as pushing the casing assembly 1" as indicated by the arrow B to make the installation pin 901 move into the second mount portion 1112 of the mount portion 111 and the blocking portion 217 of the elastic blocking structure 21" block at a side of the head portion 9011 of the installation pin 901 which is located close to the first mount portion 1111 of the mount portion 111 so as to limit the installation pin 901 in the second mount portion 1112.

Figure 18:
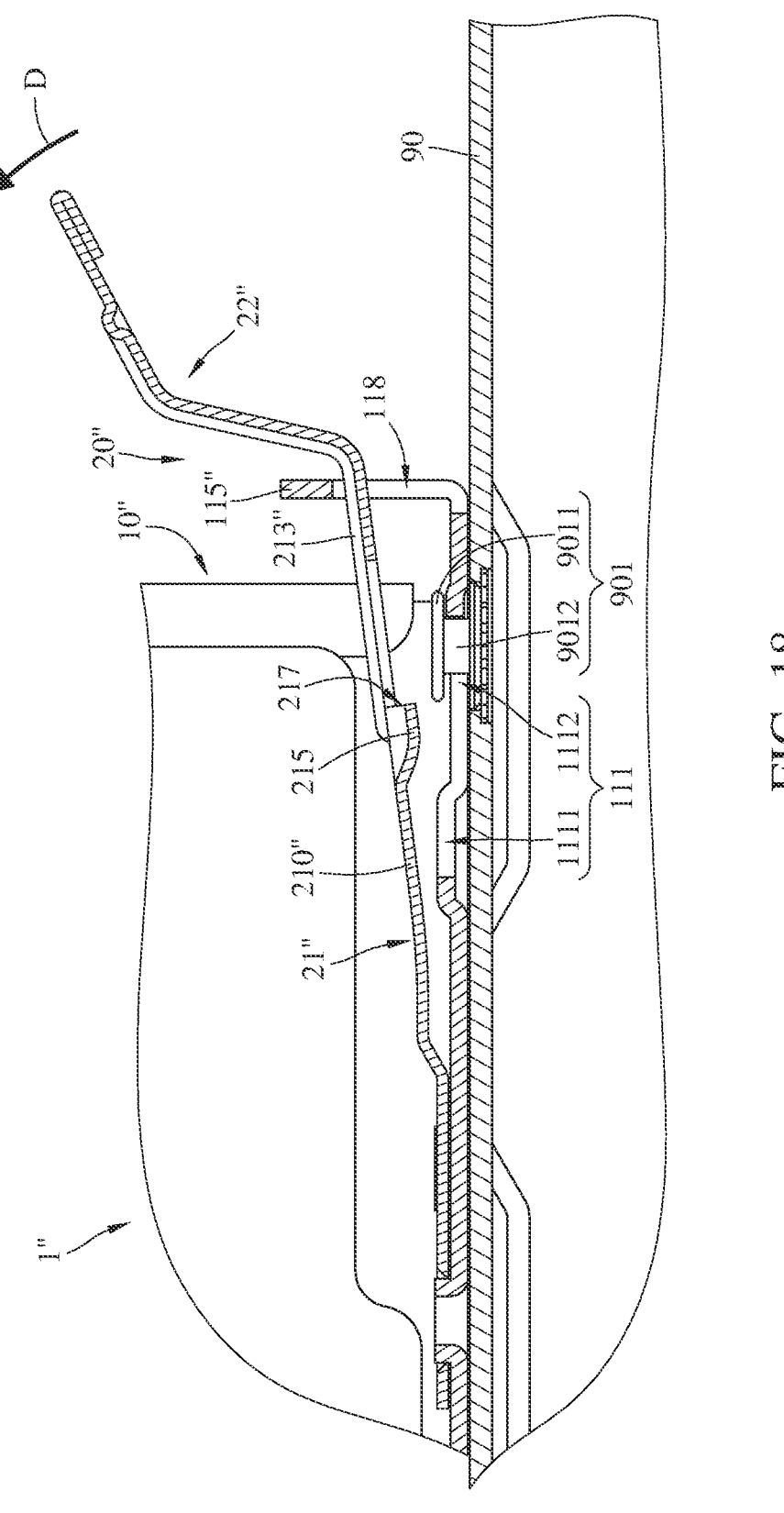
FIG. 18 is a cross-sectional side view of the casing assembly when the mount portion is detached from the installation pin by a handle portion.

Then, in FIG. 18, the handle portion 221" of the handle structure 22" can be pulled or moved in the direction as indicated by arrow D to release the casing assembly 1". Specifically, the user can move the handle portion 221" by using fingers to place on the eaves portion 119 and the handle portion 221". By doing so, the handle structure 22" is switched to the releasing position from the original position, and the handle structure 22" forces the elastic arm portion 210" of the elastic blocking structure 21" to elastically deform and therefore causes the blocking portion 217 to move away from the plate portion 110'. As such, the operation mechanism 20" is switched to the releasing status from the blocking status, and then the head portion 9011 of the installation pin 901 can be allowed to move towards the first mount portion 1111 of the mount portion 111. Then, similarly, the casing assembly 1" can be quickly removed from the device casing 90 simply by action of reversely pushing the casing assembly 1".

As introduced, the installation of the casing assembly 1" onto the device casing 90 can be realized simply by placing and pushing the casing assembly 1", and the removal of the casing assembly 1" from the device casing 90 can be realized simply by moving the handle structure 22' and reversely pushing the casing assembly 1", thus the installation and removal of the casing assembly 1" are simple, convenient, without additional hand tool and is favorable for improving the efficiency of relevant processes.

It is noted that the previous embodiments may be further modified as required; for example, in another embodiment, the carrier casing may only have one mount portion or more than two mount portions; in some other embodiments, the casing assembly may only have one operation mechanism or more than two operation mechanisms.

According to the casing assemblies and the electronic devices as discussed in the above embodiments of the disclosure, the blocking portion of the operation mechanism on the carrier casing is selectively movable to block the installation pin when the carrier casing is disposed on a device casing, thus the user is allowed to install the casing assembly on the device casing or remove the casing assembly from the device casing simply by switching the position of the blocking portion relative to the mount portion, enabling a convenient removal and installation of the casing assembly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, comprising:
a device casing comprising an installation pin;
a carrier casing comprising a plate portion and a mount portion located on the plate portion, wherein the mount portion comprises a first mount portion and a second mount portion connected to each other, the first mount portion has a first internal diameter, the second mount portion has a second internal diameter, and the first internal diameter is greater than the second internal diameter; and
an operation mechanism comprising an elastic arm portion and a blocking portion, wherein the elastic arm portion is movably disposed on the plate portion, and the blocking portion is located on a side of the elastic arm portion and selectively blocks the installation pin when the blocking portion is movable close to or away from the second mount portion, the plate portion of the carrier casing has a movement limiting portion, and a portion of the elastic arm portion is located between the plate portion and the movement limiting portion; and the operation mechanism comprises an elastic blocking structure and a handle structure, the elastic blocking structure comprises a fixed end, a free end, the elastic arm portion, and the blocking portion, the free end is connected to the fixed end via the elastic arm portion, the elastic arm portion is fixed to the plate portion of the carrier casing via the fixed end, the handle structure comprises a handle portion, an engagement portion, and a distal portion, the engagement portion is rotatably in the free end of the elastic blocking structure, the handle portion and the distal portion are respectively located at two opposite sides of the handle structure and are rotatably connected to the free end of the elastic blocking structure via the engagement portion.

2. The casing assembly according to claim 1, wherein the handle portion is located at the elastic arm portion of the elastic blocking structure, and the distal portion is selectively in contact with the plate portion of the carrier casing.

3. The casing assembly according to claim 1, wherein the operation mechanism further comprises a slope portion, the slope portion protrudes from a side of the elastic arm portion which faces toward the plate portion of the carrier casing, and the blocking portion is located at a side of the slope portion.

4. The casing assembly according to claim 3, wherein the slope portion is suspended above the second mount portion of the mount portion and partially covers the second mount portion.

5. The casing assembly according to claim 1, wherein the carrier casing further comprises an eaves portion located opposite to the plate portion of the carrier casing.

6. An electronic device, comprising:

a device casing comprising an installation pin; and a casing assembly comprising:

a carrier casing comprising a plate portion and a mount portion which is located on the plate portion, wherein the plate portion is removably stacked on the device casing, and the installation pin is disposed on the mount portion; and an operation mechanism comprising an elastic arm portion and a blocking portion, wherein the elastic arm portion is movably disposed on the plate portion, and the blocking portion is located on a side of the elastic arm portion and selectively blocks the installation pin, the plate portion of the carrier casing has a movement limiting portion, and a portion of the elastic arm portion is located between the plate portion and the movement limiting portion; and the operation mechanism comprises an elastic blocking structure and a handle structure, the elastic blocking structure comprises a fixed end, a free end, the elastic arm portion, and the blocking portion, the free end is connected to the fixed end via the elastic arm portion, the elastic arm portion is fixed to the plate portion of the carrier casing via the fixed end, the handle structure comprises a handle portion, an engagement portion, and a distal portion, the engagement portion is rotatably in the free end of the elastic blocking structure, the handle portion and the distal portion are respectively located at two opposite sides of the handle structure and are rotatably connected to the free end of the elastic blocking structure via the engagement portion.

7. The electronic device according to claim 6, wherein the handle portion is located at the elastic arm portion of the elastic blocking structure, and the distal portion is selectively in contact with the plate portion of the carrier casing.

8. The electronic device according to claim 6, wherein the operation mechanism further comprises a slope portion, the slope portion protrudes from a side of the elastic arm portion which faces toward the plate portion of the carrier casing, and the blocking portion is located at a side of the slope portion.

9. The electronic device according to claim 8, wherein the slope portion is suspended above the mount portion and partially covers the mount portion.

10. The electronic device according to claim 6, wherein the carrier casing further comprises an eaves portion located opposite to the plate portion of the carrier casing.

* * * * *